(12) United States Patent
Takahashi et al.

(10) Patent No.: US 7,955,514 B2
(45) Date of Patent: Jun. 7, 2011

(54) PLASMA PROCESSING APPARATUS AND PLASMA PROCESSING METHOD

(75) Inventors: Kazue Takahashi, Kudamatsu (JP); Hitoshi Tamura, Hikari (JP); Motohiro Tanaka, Kudamatsu (JP); Motohiko Yoshigai, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1105 days.

(21) Appl. No.: 11/679,926

(22) Filed: Feb. 28, 2007

(65) Prior Publication Data

US 2008/0169065 A1 Jul. 17, 2008

(30) Foreign Application Priority Data

Jan. 12, 2007 (JP) ................................. 2007-003972

(51) Int. Cl.
*B44C 1/22* (2006.01)
*C03C 15/00* (2006.01)
*C03C 25/68* (2006.01)
*C23F 1/00* (2006.01)

(52) U.S. Cl. .............. 216/67; 216/71; 438/710; 134/1.1
(58) Field of Classification Search .................... 216/67, 216/71; 438/710; 134/1.1
See application file for complete search history.

(56) References Cited

U.S. PATENT DOCUMENTS

| 5,367,139 | A | 11/1994 | Bennett et al. |
| 2005/0082000 | A1 | 4/2005 | Moriya et al. |
| 2007/0020941 | A1* | 1/2007 | Tamura et al. ................ 438/710 |

FOREIGN PATENT DOCUMENTS

| JP | 03-147317 | 6/1991 |
| JP | 2005-101539 | 4/2005 |
| JP | 2005-116821 | 4/2005 |

* cited by examiner

*Primary Examiner* — Roberts Culbert
(74) *Attorney, Agent, or Firm* — Antonelli, Terry, Stout & Kraus, LLP.

(57) ABSTRACT

A plasma processing apparatus having a processing chamber and a sample base, and processing a sample by using plasma generated inside the processing chamber, the processing chamber being located inside a vacuum container, the sample base being located inside the processing chamber, the sample being mounted on the sample base, the plasma processing apparatus including a component member configuring inner-side wall surface of the processing chamber, and having a dielectric portion on the inner-side wall surface, an exhaustion unit for exhausting the inside of the processing chamber, and an electric-field supply unit for supplying an electric field to the component member in a state where the plasma will not be generated inside the processing chamber, wherein magnitude of the electric field supplied from the electric-field supply unit is changed rapidly while exhausting the inside of the processing chamber by the exhaustion unit.

8 Claims, 4 Drawing Sheets

PLASMA PROCESSING APPARATUS AND PLASMA PROCESSING METHOD

BACKGROUND OF THE INVENTION

The present invention relates to a plasma processing apparatus or plasma processing method for applying a processing such as etching to a sample such as semiconductor wafer by taking advantage of plasma. More particularly, it relates to a plasma processing apparatus or plasma processing method for processing a sample while supplying an electric field into a vacuum container.

In accompaniment with the reduction of the pattern sizes of semiconductor devices, in a plasma processing process of a semiconductor fabrication apparatus, the minimum particulate size which becomes target of particulate reduction is also decreased. Simultaneously, it has also become absolutely necessary to reduce the particulate number. In such a plasma processing apparatus, conventionally, when the particulates increase due to an accumulation of deposited substances caused by repetition of the productions, it has been carried out to clean the apparatus by opening the apparatus into the atmosphere.

Also, in such a plasma processing apparatus, a process referred to as "plasma cleaning" is carried out. In this plasma cleaning, the reaction products deposited inside a processing chamber are removed by the plasma processing. As the plasma cleaning, various processes are carried out, such as a case where the plasma cleaning is carried out between lots of a wafer and a case where the plasma cleaning is carried out on each wafer-processing basis.

Meanwhile, there have been known the following methods: A method of suppressing particulate occurrence by controlling the manner of plasma generation as is disclosed in JP-A-2005-116821, a method of removing particulates by loading factors such as electromagnetic waves, sound waves, and mechanical vibration within the plasma as is disclosed in Japanese Patent No. 2741713 (corresponding to U.S. Pat. No. 5,367,139 etc.), and a method of causing microscopic particles to depart from a stage component member by applying a voltage to a wafer on-board stage, and after that, ejecting the microscopic particles through introduction of a gas as is disclosed in JP-A-2005-101539 (corresponding to U.S. Patent Publication No. 2005/082000).

SUMMARY OF THE INVENTION

In this way, the processings for implementing the particulate reduction have been carried out from conventionally. In accompaniment with the reduction of pattern size, however, the request for implementing further particulate reduction is becoming increasingly stronger. Accordingly, technologies which are more effective in the particulate reduction than conventionally is required at present. Namely, in these conventional technologies, adequate consideration has been not yet given to a point of reducing particulates resulting from microscopic particles which adhere to a wall surface inside the vacuum container.

The above-described problem is to reduce the particulates which are produced in the plasma processing. In particular, the problem is to reduce the particulates resulting from the microscopic particles which adhere to the wall surface inside the plasma processing apparatus. Taking the pattern size reduction on semiconductor devices into consideration, it is absolutely necessary to reduce the particulates including the ones whose size is smaller than the particulate size which has been regarded as the problem from conventionally. Incidentally, here, what is referred to as "particulates" means microscopic particles which adhere to a wafer. Meanwhile, what is referred to as merely "microscopic particles" means microscopic particles which do not adhere to the wafer.

It is an object of the present invention to provide a plasma processing apparatus or plasma processing method for suppressing particulates from occurring in a sample located inside a vacuum container.

The above-described object can be accomplished by removing microscopic particles which adhere to surfaces of components or a wall component member of a processing chamber. This elimination is implemented by causing the microscopic particles to depart from the surfaces, and transferring the microscopic particles to outside of the processing chamber. Namely, the above-described object can be accomplished as follows: For the departure of the microscopic particles and under a condition that plasma will not be generated, high-frequency electromagnetic waves are applied into the processing chamber from a plasma source in a predetermined time. Moreover, the microscopic particles are vacuum-exhausted through introduction of a gas into the processing chamber.

In more detail, the above-described object can be accomplished by the following plasma processing apparatus: Namely, a plasma processing apparatus having a processing chamber and a sample base, and processing a sample by using plasma generated inside the processing chamber, the processing chamber being located inside a vacuum container, the sample base being located inside the processing chamber, the sample being mounted on the sample base, the plasma processing apparatus including a component member configuring inner-side wall surface of the processing chamber, and having a dielectric portion on the inner-side wall surface, an exhaustion unit for exhausting the inside of the processing chamber, and an electric-field supply unit for supplying an electric field to the component member in a state where the plasma will not be generated inside the processing chamber, wherein magnitude of the electric field supplied from the electric-field supply unit is changed rapidly while exhausting the inside of the processing chamber by the exhaustion unit.

Otherwise, the above-described object can be accomplished by the following plasma processing method: Namely, a plasma processing method for mounting a sample on a sample base inside a processing chamber, and after that, processing the sample by generating plasma inside the processing chamber, the processing chamber being located inside a vacuum container, and being evacuated by an exhaustion unit, the plasma processing method including a step of supplying an electric field to a component member while exhausting the inside of the processing chamber by the exhaustion unit and in a state where the plasma will not be generated inside the processing chamber, the component member configuring inner-side wall surface of the processing chamber, and having a dielectric portion on the inner-side wall surface, magnitude of the electric field having been changed rapidly.

Further, the above-described object can be accomplished as follows: After supplying the electric field in the state where the plasma will not be generated, the processing chamber is exhausted by the exhaustion unit while introducing a gas into the processing chamber. Also, a gas is introduced into the processing chamber while supplying the electric field in the state where the plasma will not be generated.

Still further, the above-described object can be accomplished as follows: While generating a magnetic field inside the processing chamber, the electric field is supplied in the state where the plasma will not be generated.

Still further, the above-described object can be accomplished as follows: The high-frequency electric field is supplied into the processing chamber from the electric-field supply unit in a state where the sample is not mounted on the sample base, the sample being a processing target.

Still further, the above-described object can be accomplished as follows: After halting the supply of the electric field from the electric-field supply unit, the sample is processed by locating the sample inside the processing chamber, and generating the plasma inside the processing chamber, the sample being a processing target.

Otherwise, the above-described object can be accomplished by the following plasma processing apparatus: Namely, a plasma processing apparatus for locating a sample inside a processing chamber in which a vacuum-processed space is formed, and processing the sample by generating plasma inside the processing chamber, the plasma processing apparatus including a control unit for performing supply/halt of high-frequency power into the processing chamber from the high-frequency power source for generating the plasma under a condition that the plasma will not be generated inside the processing chamber.

Further, the above-described object can be accomplished by the following plasma processing apparatus: Namely, a plasma processing apparatus further including a sample base for locating the sample inside the processing chamber, and a counter electrode countered to the sample base, and wherein the high-frequency power source for generating the plasma is connected to the counter electrode, the supply/halt of the high-frequency power into the processing chamber from the high-frequency power source being performed under the condition that the plasma will not be generated inside the processing chamber.

Also, the above-described object can be accomplished by the following plasma processing apparatus: Namely, a plasma processing apparatus for locating a sample inside a processing chamber, and processing the sample by generating plasma inside the processing chamber by using an induction electric field from outside of the processing chamber, the processing chamber being partially composed of a dielectric, and a vacuum-processed space being formed in the inside of the processing chamber, the plasma processing apparatus including a control unit for performing supply/halt of the induction electric field into the processing chamber under a condition that the plasma will not be generated inside the processing chamber.

Otherwise, the above-described object can be accomplished by the following plasma processing method: Namely, a plasma processing method for locating a sample inside a processing chamber in which a vacuum-processed space is formed, and processing the sample by generating plasma inside the processing chamber, the plasma processing method including a step of performing supply/halt of high-frequency power into the processing chamber from a high-frequency power source for generating the plasma for each sample processing under a condition that the plasma will not be generated inside the processing chamber.

Other objects, features and advantages of the invention will become apparent from the following description of the embodiments of the invention taken in conjunction with the accompanying drawings.

DESCRIPTION OF THE INVENTION

Figure 1:
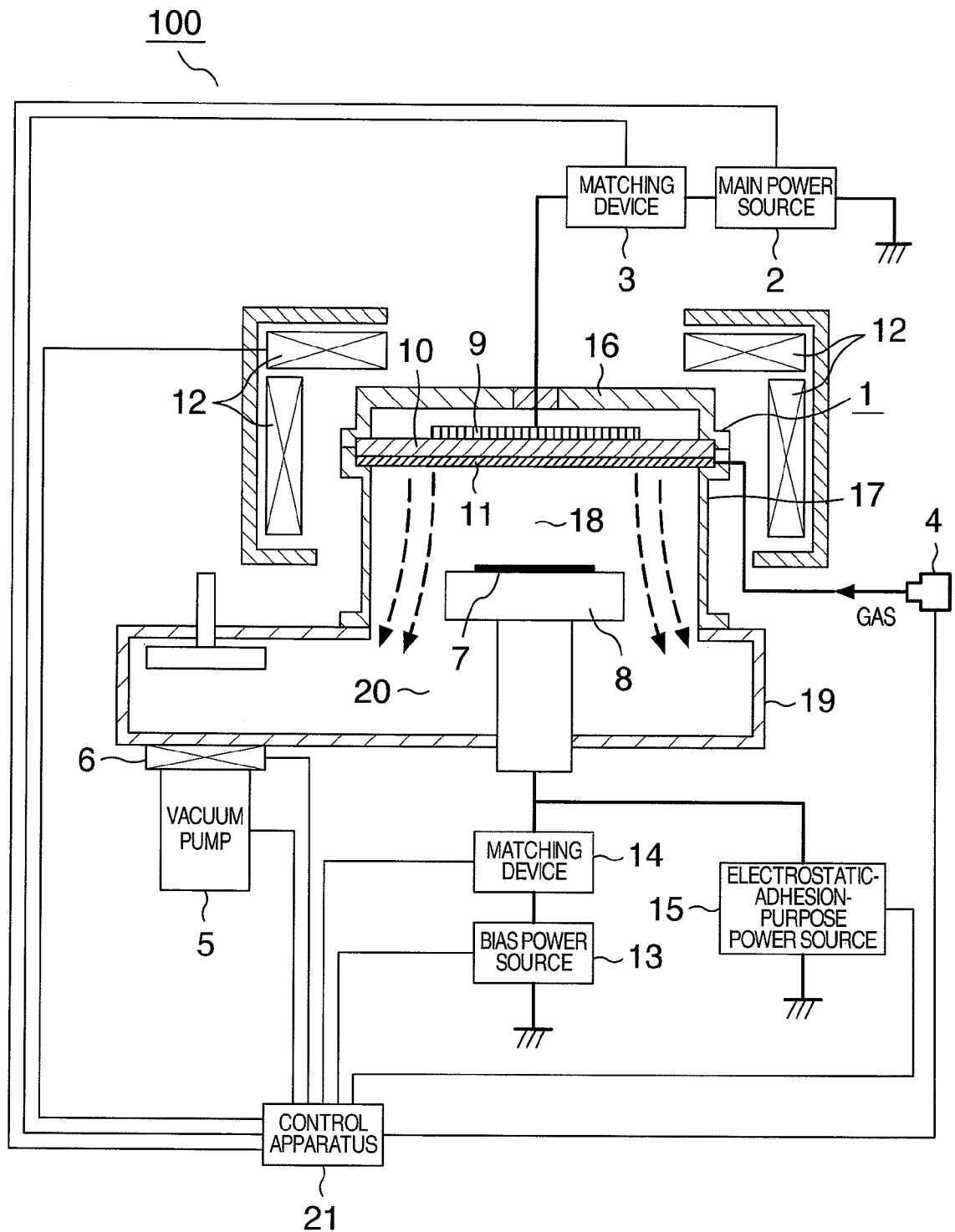
FIG. 1 is a longitudinal cross-sectional view for illustrating overview of configuration of a plasma processing apparatus according to an embodiment of the present invention.

As factors for the occurrence of particulates, e.g., the following factors are conceivable: (1) microscopic particles adhering to washed components depart therefrom, then adhering to the wafer. (2) reaction products produced during the plasma processing adhere to and are deposited on the wall surface inside the vacuum container in which a sample is mounted, and then the reaction products adhere to the sample surface due to such phenomenon as cracking occurrence, film flaking, and departure of the deposited film. (3) component members configuring inside of the vacuum container depart therefrom by a reaction with plasma irradiation or sputtering to adhere to the wafer directly, or a component member adhering to surface of another component member re-departs then to adhere to the sample. (4) a gas supplied for the plasma processing in a gaseous phase reacts during the plasma processing, and generates microscopic particles, which adhere to the sample. (Incidentally, the component members inside the vacuum container refer not only to the wall surface of the processing chamber, which is situated inside the vacuum container and in which the sample is located and the plasma will be generated, but also to surfaces of all the component members inside the vacuum container to which the microscopic particles can adhere, such as surface of the vacuum container, surfaces of components inside the processing chamber, surfaces of configuration components of a wafer on-board stage, and surface of an exhaustion adjusting valve below the processing chamber.

With respect to these causes for the occurrence of the particulates, in the present invention, in particular, the object is to reduce the particulates resulting from the microscopic particles which adhere to the wall surface inside the vacuum container. Such microscopic particles which adhere to the wall surface include both microscopic particles which could not be completely eliminated by the wet-cleaning and the microscopic particles which are produced during the plasma processing.

Adhesion forces which are exerting between the wall surface and the microscopic particles adhering to the wall surface are, basically, Van der Waals force and electrostatic force. On the wall surface in a state of being not charged, main factor out of such adhesion forces becomes Van der Waals force. Although the adhesion of the microscopic particles by Van der Waals force is stable when the distance between the microscopic particles and the wall surface is equal to about 0.04 nm, the adhesion decreases rapidly if the distance therebetween becomes larger.

However, when removing the adhering microscopic particles, it is required to apply, to the microscopic particles, removal forces which exceed the adhesion forces. Also, these removal forces become smaller in magnitude as the microscopic particles become smaller in size. Accordingly, the smaller the microscopic particles become, the more difficult it becomes to remove them. Consequently, it is required to add large forces as the removal forces for the microscopic particles.

As a method for obtaining the large removal forces, it is possible to exceed Van der Waals force by adding mutually repulsive electrostatic forces between the wall surface and the microscopic particles adhering thereto. This method makes it possible to cause the microscopic particles to depart from the wall surface. The microscopic particles which have departed from the wall surface can then be exhausted to the outside by vacuum exhaustion of the inside of the processing chamber. This exhaustion decreases the number (quantity) of microscopic particles on the wall surface, thereby allowing implementation of the particulate reduction.

The present invention applied has been devised based on the above-described idea and expertise of the inventor et al. Namely, high-frequency electromagnetic field for generating plasma is introduced into the processing chamber without generating the plasma, thereby adding the mutually repulsive electrostatic forces between the wall surface and the microscopic particles adhering thereto.

Hereinafter, referring to the drawings, the explanation will be given below concerning embodiments of the present invention. As a representative example of the plasma processing, an embodiment in a plasma etching apparatus will be described.

Embodiment 1

Hereinafter, referring to FIG. 1 to FIG. 2, the explanation will be given below concerning embodiments of the present invention. FIG. 1 is a longitudinal cross-sectional view for illustrating overview of configuration of a plasma processing apparatus according to an embodiment of the present invention.

In the present embodiment, a plasma processing apparatus 100 includes a vacuum container 1 in the internal space of which a sample 7, i.e., a processing target, is located, a main power source 2 and matching device 3 for generating plasma, and an etching-gas gas supply unit 4. The apparatus 100 further includes a vacuum exhaustion unit located in its lower portion and including a vacuum pump 5 for exhausting the internal space of the vacuum container 1 and an adjustment valve 6 for adjusting the pumping speed and pressure of the internal space.

Moreover, inside the vacuum container 1, there is provided a substantially cylinder-shaped stage 8, i.e., a sample base on the upper surface of which the sample 7 is to be mounted. The vacuum container 1 in the present embodiment includes a discharge-chamber container 17 and a vacuum-chamber container 19. The inside of the discharge-chamber container 17 is sealed by a connection with a lid component member 16 located on the upper portion thereof. In addition, the discharge-chamber container 17 is of a substantially cylinder shape, and surrounds the stage 8 located coaxially with the central axis of the container 17. The vacuum-chamber container 19 is connected to the lower portion of the container 17, and a bias power source 13, a matching device 14, and the vacuum pump 5 are located under the container 19. Furthermore, there exists a space which is situated above the stage 8, and which is surrounded by the discharge-chamber container 17, a quarts window 10 located below the lid component member 16, and a shower plate 11 located under the quarts window 10. This space is a discharge chamber 18 in which a processing gas introduced from a plurality of introduction apertures located in the shower plate 11 is converted into plasma. Incidentally, in the present embodiment, the vacuum-chamber container 19 and the discharge-chamber container 17 connected thereto are grounded by a predetermined unit, and exhibit an effect as an electrode which becomes a constant electric potential with respect to the plasma facing the containers on the inner-side surfaces.

In the present embodiment, a 450-MHz-frequency UHF-band electric field is supplied from the main power source 2 via the matching device 3 to an antenna 9 located inside the lid component member 16 on the upper portion of the vacuum container 1. Moreover, this 450-MHz-frequency electric field is radiated into the discharge chamber 18 from this antenna 9 via the dielectric-manufactured quarts window 10 and the shower plate 11 located under the antenna 9. Meanwhile, a coil 12 for generating a magnetic field is set up in surroundings of the lid component member 16 and the discharge-chamber container 17. An electric field formed by the electric field supplied from the antenna 9 and the magnetic field supplied from the coil 12 cause an electron cyclotron resonance to occur inside the discharge chamber 18, thereby generating the plasma.

In the present embodiment, the lid component member 16 configures the upper portion of the vacuum container 1 above the substantially cylinder-shaped wall of the discharge-chamber container 17. Moreover, the lid component member 16 is configured such that the inside of the member 16 is connected to the antenna 9 and a dielectric-manufactured ring-shaped component member which surrounds the upper portion and surroundings of the antenna 9. The quarts window 10 and the shower plate 11 are located under the antenna 9 and the dielectric-manufactured ring. The electric field based on the electric power from the main power source 2 and radiated from the antenna 9 passes through the dielectric-manufactured ring and the quarts window 10, then appearing as an electric wave which propagates along the surface of the shower plate 11. This electric field propagates from the shower plate 11 into the discharge chamber 18, thereby exciting the processing gas supplied into the discharge chamber 18. Meanwhile, inner-side surface of side wall of the discharge-chamber container 17 is coated with a dielectric-manufactured film, faces the discharge chamber 18, and is exposed to the above-described electric field. Accordingly, an electric wave based on the electric field propagates inside the dielectric-manufactured film and along the surface thereof.

The bias power source 13 and the matching device 14 are connected to the stage 8 in order to apply a high-frequency bias to the sample 7. The sample 7 is supported by electrostatic adhesion in such a manner that the sample 7 is mounted on a substantially circle-shaped on-board surface which is the upper surface of the stage 8 and which is positioned in a manner of being countered to the shower plate 11. On account of this, an electrostatic-adhesion-purpose power source 15 for supplying electric power to an electrode located in a dielectric-manufactured film configuring the on-board surface is connected to the bias power source 13 and the matching device 14 in parallel.

Also, the plasma processing apparatus 100 includes a control apparatus 21 which is located at a location where the plasma processing apparatus 100 is set up, or at a remote location where communications with the respective units of the apparatus 100 are executable. This control apparatus 21 detects states of operations of the respective units such as the main power source 2, the matching device 3, the gas supply unit 4, the bias power source 13, the matching device 14, the electrostatic-adhesion-purpose power source 15, the vacuum pump 5, and the exhaustion adjustment valve 6. At this time, the control apparatus 21 detects these states by receiving and following detection outputs from sensors attached to the respective units. Simultaneously, the control apparatus 21 issues operation instructions in response to the detection results so that the operations of the respective units will be brought into suitable states.

Incidentally, although not illustrated in the drawing, a refrigerant is supplied from a refrigerant supply apparatus into the stage 8 in order to control temperature of the stage 8. A refrigerant supply pipe for this purpose is connected to the stage 8. Furthermore, a heat-conducting gas, e.g., helium gas, is supplied between rear surface of the sample 7 and the on-board surface of the stage 8. This supply promotes heat conduction between the sample 7 and the stage 8 whose temperature is controllable, thereby making it possible to control temperature of the sample 7.

When performing the plasma processing of the sample 7, e.g., a plasma etching processing thereof, the sample 7 is transported and mounted onto the stage 8 by a sample transportation apparatus which is not illustrated in the drawing. Next, the processing gas is supplied into the discharge chamber 18 from the gas supply unit 4 via the introduction apertures of the shower plate 11. Simultaneously, operations of the vacuum pump 5 and the exhaustion adjustment valve 6 are adjusted, thereby adjusting the pressure inside the discharge chamber 18 and the vacuum chamber 20.

Moreover, after the sample 7 has been caused to electrostatically adhere to the stage 8 and held thereon, the magnetic field from the coil 12 and the electric field from the antenna 9 by the electric power from the main power source 2 are supplied into the discharge chamber 18. This supply excites the processing gas, thereby generating the plasma. Next, the bias power source 13 is supplied to the stage 8, and thus the high-frequency bias is applied onto surface of the sample 7. Then, based on an electric potential difference between the bias electric potential and the plasma, ions within the plasma are attracted onto the surface of the sample 7, thereby starting the etching.

After the etching processing has been applied in a predetermined time or up to a predetermined etching quantity, the bias power source 13 is halted to terminate the etching processing. After the halt of the bias power source 13, via halt of the supply of the electric power from the main power source 2, halt of the supply of the electric power from the electrostatic-adhesion-purpose power source 15, and halt of the supply of the etching gas, the sample transportation apparatus not illustrated in the drawing transports out the sample 7 whose etching has been terminated. After that, the next sample is transported in, then repeating the above-described operation.

Furthermore, in the present embodiment, in order to suppress occurrence of particulates and a lowering in the etching performance, a cleaning processing is performed between the processes for processing the sample 7. Here, the occurrence of the particulates results from reaction products produced and deposited during the etching processing in the processing chamber inside the vacuum container 1 including the discharge chamber 18 and the vacuum chamber 20.

What is usually performed as this cleaning processing is as follows: Namely, the deposited products are reacted and converted into a volatile gas by causing the deposited products to mutually interact with the plasma generated inside the discharge chamber 18. Then, this volatile gas is ejected to the outside of the processing chamber. For example, a gas containing oxygen or fluorine is used for a carbon-based deposited product. A gas containing fluorine, chlorine, or bromine is used for a silicon-based deposited product. A gas containing chlorine or bromine is used for an aluminum-based deposited product. The deposited products are substantially eliminated by the cleaning processing. Depending on cases, however, deposited products which are rather difficult to eliminate by the cleaning processing increase in number as the processing number of the samples 7 increases. This causes the particulates adhesion. When the deposited products which can not be eliminated by the plasma-used cleaning processing adhere onto the vacuum container 1, a cleaning is carried out which opens the vacuum container into the atmosphere.

An object to enhance the processing throughput requires that the time-interval until cleaning the vacuum container 1 by opening the vacuum container into the atmosphere be lengthened. In recent years, in accompaniment with the reduction of pattern size on semiconductor devices, management value for the size and number of particulates adhering to a semiconductor wafer has become severer. On account of this, development of a technology is requested which makes it possible to reduce the particulates which can not be completely removed by the conventional cleanings and the plasma-used cleaning processing carried out periodically or temporarily.

Figure 2:
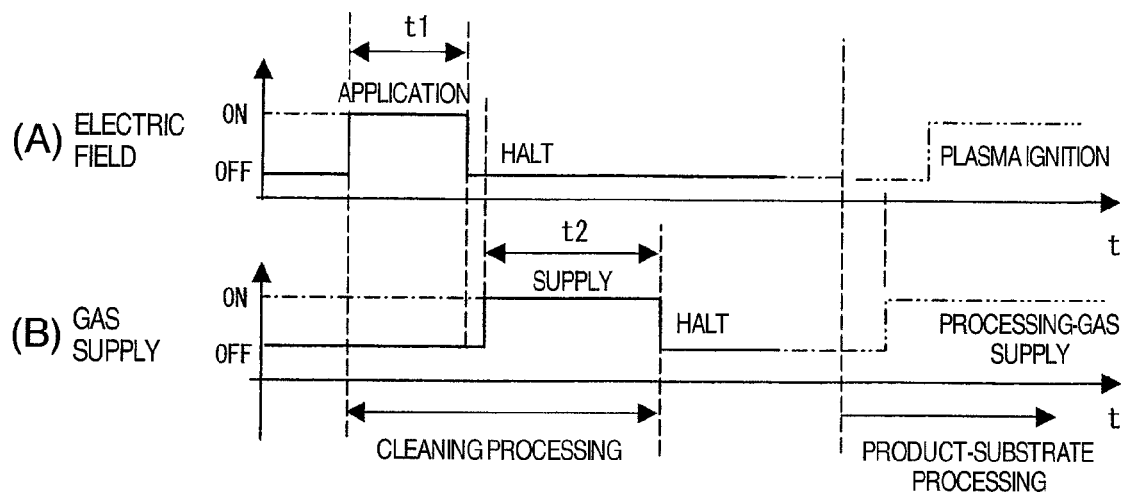
FIG. 2 is a graph for illustrating an operation change relative to a time change in the plasma processing apparatus according to the embodiment illustrated in FIG. 1.

FIG. 2 illustrates an operation for the particulate reduction according to the embodiment of the present invention. FIG. 2 is a graph for illustrating an operation change relative to a time change in the plasma processing apparatus according to the embodiment illustrated in FIG. 1.

First, in a state where the inside of the processing chamber including the discharge chamber 18 is exhausted under a high vacuum, the supply of an electric field based on predetermined-frequency (450 MHz, here) electric power is started from the main power source 2 to the antenna 9. This operation starts the cleaning processing in the present embodiment. The supply of the electric field will be maintained during a time t1 (e.g., 10 seconds in the present embodiment).

Incidentally, in the cleaning processing in the present embodiment, the sample 7 for manufacturing the product is not mounted on the on-board surface on the stage 8. Accordingly, it is suppressed that microscopic particles emitted from the wall surface of the processing chamber by the cleaning processing will adhere to the sample 7 and become particulates. Also, in the cleaning processing in the present embodiment, at a point-in-time of the supply of the electric field or during the time t1, pressure inside the processing chamber is lowered down to an order of $10^{-3}$ Pa. Consequently, at this time, no plasma will be generated inside the processing chamber.

The electric field introduced from the antenna 9 into the processing chamber propagates into the space inside the processing chamber such as the discharge chamber 18. Simultaneously, if the wall surface of the discharge-chamber container 17 is an electrical conductor, the electric field propagates along surface of the electrical conductor; whereas if the wall surface of the discharge-chamber container 17 is a dielectric, the electric field propagates into the inside of the dielectric as well. In the present embodiment, an aluminum oxide film or yttria film is formed on the wall surface of the discharge-chamber container 17 facing the discharge chamber 18. On account of this, the electric field propagates inside the dielectric like this in the present embodiment.

In this way, the electric field propagates inside the dielectric. As a result of this, the microscopic particles, which adhere to the inner-side wall surface of the processing chamber coated with the dielectric film, are electrically charged.

Then, the electrically-charged microscopic particles are emitted out of this wall surface by a repulsive force. The microscopic particles receive this repulsive force from the surrounding matters onto which the electric field is exerted similarly. The microscopic particles emitted out of the wall surface are positively or negatively charged, depending on the situation at this time.

Next, the radiation of the electric field is halted after a lapse of the time t1. Then, an argon gas is introduced into the discharge chamber 18 from the gas supply unit 4 with a flow quantity of 500 ml/min and during a time t2. The pressure at this time has been equal to 4 Pa. The microscopic particles emitted into the processing chamber are ejected to the outside of the vacuum container 1 together with the introduced argon gas by an activation of the vacuum pump 5. Incidentally, although the start of supply of the argon gas may be before the lapse of t1, it is desirable to maintain the supply after the lapse of t1 as well.

The electric field which keeps being supplied is halted in this way. As a result of this, the electric field propagating inside the dielectric film on the wall surface is also reduced rapidly.

On account of the rapid change in time of the magnitude or intensity of the electric field made by the supply/halt of the electric field like this, the charged microscopic particles depart from the wall surface, then being emitted into the processing chamber. The microscopic particles emitted exhibits a tendency that, with a lapse of time, the microscopic particles emit the charges they have assumed, thereby becoming neutral again to adhere to the wall surface. Accordingly, the microscopic particles are ejected to the outside of the vacuum container 1 from the discharge chamber 18 or the vacuum chamber 20 thereunder by the activation of the vacuum pump 5. In the present embodiment, at this time, an inert gas such as argon gas is introduced into the processing chamber. This makes it easy to eject the microscopic particles to the outside of the vacuum container 1 together with the argon gas.

After a lapse of t2, i.e., the time of supply of the gas, the cleaning processing is terminated. After that, after a lapse of a predetermined time, the sample 7 for manufacturing the product is transported into the processing chamber, then being mounted onto the stage 8. Moreover, after introduction of the processing gas, the electric field is supplied into the processing chamber under a predetermined pressure condition. This generates plasma inside the processing chamber. The plasma in the present embodiment is generated by taking advantage of the electron cyclotron resonance (ECR) based on the magnetic field supplied from the coil 12.

The above-described change in time of the electric field may be implemented not only by halting the electric field, but also by a rapid increase or increase/decrease in the magnitude. Also, repeating these operations is allowable. For example, on/off of a predetermined-magnitude output or a pulse-shaped output from the main power source 2 is also allowable. Otherwise, an arbitrary-magnitude output may be increased up to a larger output in a step-like manner, or may be decreased down to a smaller output in a step-like manner. Moreover, arbitrary values may be averaged, thereby being changed into a larger or smaller value. Otherwise, a predetermined-frequency output may be superimposed on another output, thereby being changed in time.

Incidentally, in the state where the plasma will be generated inside the processing chamber, an ion sheath is formed on the wall surface of the processing chamber which is exposed to the plasma. By the way, it is desirable that the microscopic particles will receive an electric force, and will depart from the wall surface on which the dielectric film is formed. Implementing this situation requires that the microscopic particles receive the repulsive force by being negatively charged. This is because the surface of the dielectric film is maintained at a negative electric potential by influences of the incoming electrons. Consequently, the microscopic particles which have departed from the wall surface are negatively charged at first.

The inside of the ion sheath, however, has become an area where there are a large number of positive ions. Accordingly, the negatively-charged microscopic particles are neutralized, or are positively charged by the collision with the positive ions. As a result, these microscopic particles are pulled back to the wall surface again by such forces as an electric pressure by the plasma potential from the plasma side and an attractive force by the negative potential on the wall surface. As a result, the microscopic particles which will depart from the wall surface decrease in number. From this viewpoint, in the present embodiment, the electric field is caused to propagate in the state where the plasma will not be generated.

Incidentally, in the present embodiment, there exists a possibility that the microscopic particles which have departed from the wall surface will re-adhere to the surface of the sample stage 8. On account of this, a dummy sample 7, which is not used as the product, may be mounted in advance on the on-board surface on the stage 8, and the dummy sample 7 may be transported out at a point-in-time when the cleaning processing is terminated. Microscopic particles which have adhered to the dummy sample 7 are transported to the outside together therewith. This suppresses the surface of the stage 8 from being contaminated. As explained so far, by reducing the microscopic particles which adhere to the wall surface, it becomes possible to reduce the particulates in the accrual plasma processing.

Figure 3:
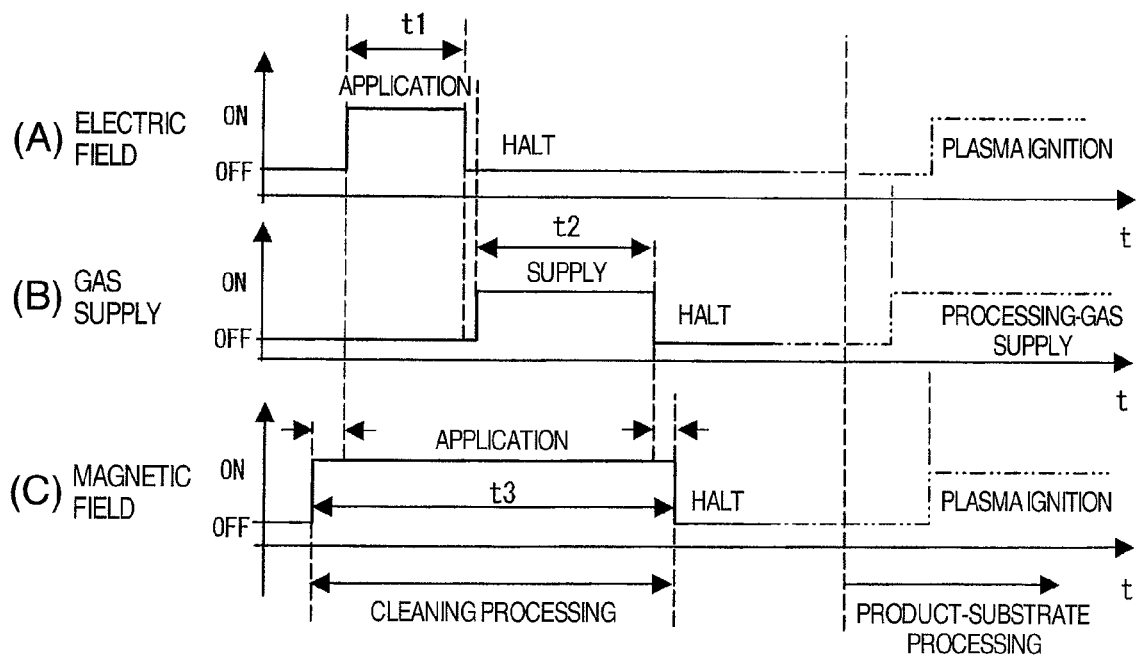
FIG. 3 is a graph for illustrating an operation change relative to a time change in a modified embodiment of the plasma processing apparatus according to the embodiment illustrated in FIG. 1.

Hereinafter, referring to FIG. 3, the explanation will be given below concerning a modified embodiment of the above-described embodiment illustrated in FIG. 2. FIG. 3 is a graph for illustrating an operation change relative to a time change in the modified embodiment of the plasma processing apparatus according to the above-described embodiment of the present invention.

In this modified embodiment, basically the same operation as in the above-described embodiment is performed. Furthermore, here, the magnetic-field generation function used for the electron cyclotron resonance is taken advantage of. The microscopic particles which have departed from the wall surface in accordance with the steps in the above-described embodiment are electrically charged. Accordingly, in order to not allow the microscopic particles to adhere to the wall surface again, a magnetic field supplied from the coil 12 and traveling from above to below is generated as is indicated by arrows in FIG. 1. The arrows indicating this magnetic field travel from the upper portion of the outer-circumferential limb side of the discharge chamber 18 to below, then passing through the space between the discharge-chamber container 17 or the vacuum-chamber container 19 and the outer-circumferential portion of the stage 8, and traveling to below the stage 8. In order to apply the magnetic field which has the perpendicular-direction component like this, e.g., it is conceivable to flow the current in only the lower-side coil of the coil 12 without flowing the current in the upper-side coil thereof.

When the magnetic field like this is generated, the charged microscopic particles move by receiving a force along the magnetic force lines. This makes it difficult for the charged microscopic particles to adhere to the wall surface. Consequently, simultaneously when or before the electric field is supplied and applied into the processing chamber, the magnetic field is generated and supplied into the processing chamber by using the coil 12. After that, the microscopic particles adhering to the wall surface are caused to depart therefrom by the propagation of the electric field from the antenna 9. The charged microscopic particles in a gaseous phase are constrained by the magnetic field inside the processing chamber. This makes it difficult for the charged microscopic particles to move to the wall surface of the processing chamber, which suppresses the re-adhesion of the particles thereto.

In this state, similarly to the above-described embodiment, a gas such as argon gas is supplied during the time t2. Then, the microscopic particles are ejected to the outside of the vacuum container 1 together with the argon gas. This efficiently ejects the microscopic particles to the outside of the vacuum container 1, thereby clarifying the inside of the processing chamber. As a result, it becomes possible to reduce the particulates which will adhere to the sample 7. Also, the stage 8 can be prevented from being contaminated by mounting the dummy sample 7 on the stage 8. This is basically the same method in the above-described embodiment.

The magnetic field supplied from the coil 12 is supplied during at least a time t3, which is longer than the time t1 during which the supply of the electric field has been terminated. This is performed in order that the microscopic particles emitted from the wall surface by the supply of the electric field will be influenced by the magnetic field without fail. In the present modified embodiment, the supply of the magnetic field is halted after the supply of the argon gas is halted. Namely, the magnetic field is reduced after the step of exhausting the microscopic particles together with the argon gas has been terminated, and thus after the microscopic particles have been removed sufficiently.

Also, the propagation of the electric field supplied, the introduction of the gas, and the supply of the magnetic field which are described above are regarded and dealt with as a single cycle, and this cycle is repeated. This method decreases the microscopic particles adhering to the wall surface, thereby clarifying the inside of the processing chamber. Incidentally, although the argon gas has been introduced in the present embodiment, another inert gas or the gas used for the etching is also preferable. Otherwise, the gas used for the plasma processing is preferable. Since the cleaning processing in the present embodiment is performed under the condition that the plasma will not be generated, the gas type is not limited in particular.

Figure 4:
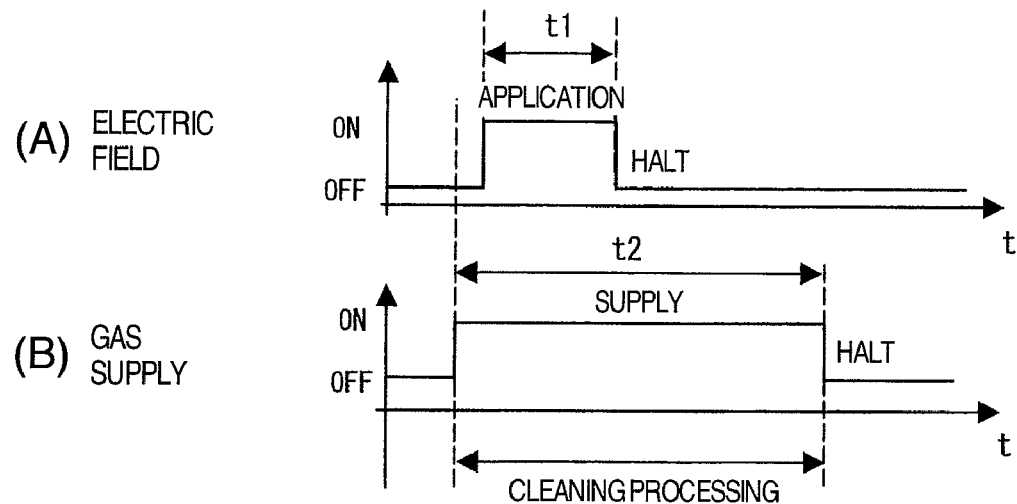
FIG. 4 is a graph for illustrating an operation change relative to a time change in another modified embodiment of the plasma processing apparatus according to the embodiment illustrated in FIG. 1.

Next, referring to FIG. 4, the explanation will be given below concerning another modified embodiment. FIG. 4 is a graph for illustrating an operation change relative to a time change in another modified embodiment of the plasma processing apparatus according to the embodiment illustrated in FIG. 1.

In the present embodiment, unlike the above-described embodiment and the modified embodiment in FIG. 3, the supply of the argon gas into the processing chamber from the gas supply unit 4 is started before the supply of the electric field. Simultaneously with the start of the supply of the argon gas or thereinafter, the electric field is radiated from the antenna 9 to supply the electric field into the processing chamber, thereby causing the electric field to propagate along the wall surface. Similarly to the above-described embodiment, the argon gas keeps to be supplied after a lapse of the time t1 during which the electric field is supplied. Then, the supply of the argon gas is halted after a lapse of the time t2 from the start of the supply of the argon gas.

The propagation of the electric field seldom changes whether the inside of the processing chamber is exhausted into the vacuum or is after the introduction of the gas. The microscopic particles which have departed from the wall surface by the electromagnetic waves are vacuum-exhausted together with the gas, thereby being ejected to the outside. In the present embodiment, the processing step for the gas supply differs from in the first and second embodiment. If, however, the power of the main power source 2 required for causing the microscopic particles on the wall surface to depart therefrom is permitted to be small enough, the gas is introduced from the beginning, then applying the electromagnetic waves in that state.

If the pressure for the gas introduction becomes equal to an order of a few Pa, the plasma is ignited in some cases. Avoiding this situation requires that the power supplied from the main power source 2 be made smaller. In the present embodiment, the power is set at 300 W. As a result, it has been found successful that the microscopic particles could be caused to depart from the wall surface without generating the plasma. With respect to the microscopic particles which will not depart from the wall surface by the electric field with the weak power, the power needs to be increased. In that case, however, the pressure can be lowered by decreasing the supplied gas quantity, or like the above-described embodiment, the supply of the gas from the gas supply unit 4 can be carried out after the supply of the electric field is halted.

Figure 5:
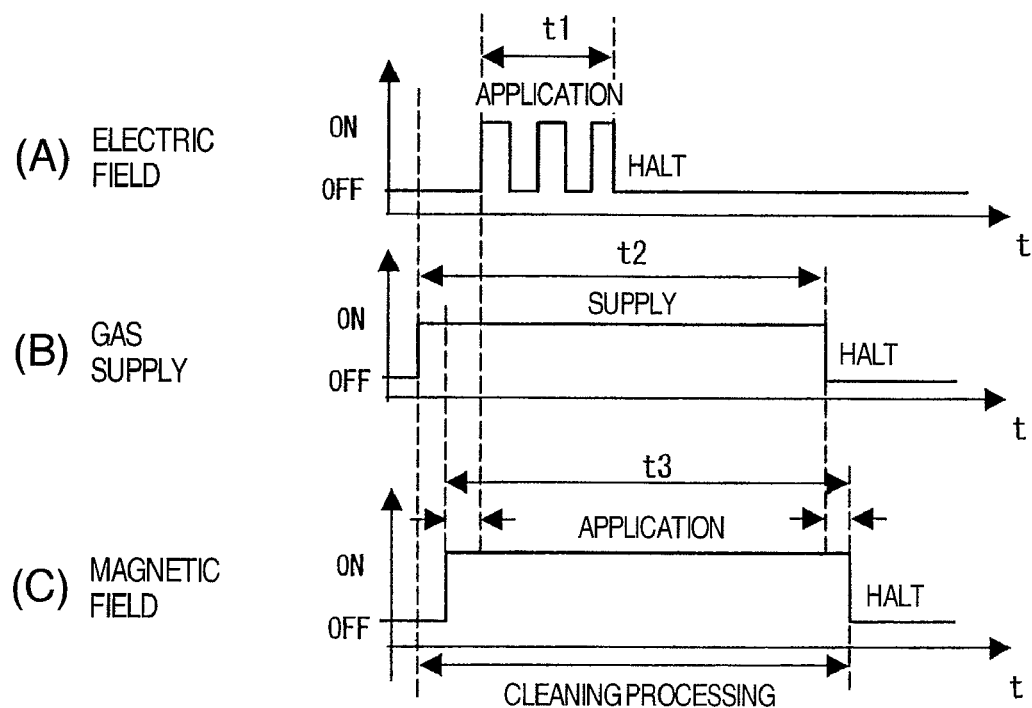
FIG. 5 is a graph for illustrating an operation change relative to a time change in still another modified embodiment of the plasma processing apparatus according to the embodiment illustrated in FIG. 1.

Next, the explanation will be given below concerning still another modified embodiment of the embodiment illustrated in FIG. 1. FIG. 5 is a graph for illustrating an operation change relative to a time change in still another modified embodiment of the plasma processing apparatus according to the embodiment illustrated in FIG. 1.

The modified embodiment illustrated in FIG. 5 results from applying the magnetic field to the modified embodiment illustrated in FIG. 4, thereby suppressing the microscopic particles from re-adhering to the wall surface. In the present embodiment, similarly to FIG. 4, supply of the gas such as argon gas is started before supply of the electric field is started. Moreover, after that, before the supply of the electric field is started, the magnetic field is generated and supplied into the processing chamber by using the coil 12 illustrated in FIG. 1. While maintaining the state where the gas and the magnetic field are supplied into the processing chamber in this way, the application of the electric field is started under the condition that the plasma will not be generated inside the processing chamber.

The electric field is supplied in a manner of being repeated at plural times with a predetermined intensity and a specific time interval. The supply time for the electric field, which ranges from the start of application of the plural electric fields to the halt thereof later, is set at the time t1 similarly to the embodiments described so far. The supply of the gas and that of the magnetic field are maintained after a lapse of the time t1, i.e., the supply time for the electric field.

Inside the processing chamber at the time t1 during which the electric field is supplied, the microscopic particles which have departed from the wall surface are exhausted immediately to the outside together with the supplied gas. Also, the charged microscopic particles are constrained by the magnetic force lines supplied in parallel with the electric field and the gas. This situation suppresses the microscopic particles from moving and adhering to the sample 7 on the on-board surface on the stage 8. As a result of this, it becomes possible to reduce the particulates which will adhere to the sample 7 in the actual plasma processing.

Also, in this modified embodiment, the reason for supplying the above-described electric field intermittently is that the impactive electrical removal force can be given to the microscopic particles adhering to the surface of the inner-side surface of the processing chamber. This allows the departure of the microscopic particles to be implemented more efficiently, thereby making it possible to enhance the effect of the particulate reduction. Also, the electromagnetic waves may be pulse-shaped ones. The object of the present invention can be accomplished as long as the electric field to be requested is in a mode which permits the electric field to propagate along the wall surface of the processing chamber and in the space inside the processing chamber. In particular, by causing an instantaneous potential variation to occur to the microscopic particles adhering to the surface of the inner-side surface, it becomes possible to cause the microscopic particles to depart from the wall surface.

Figure 6:
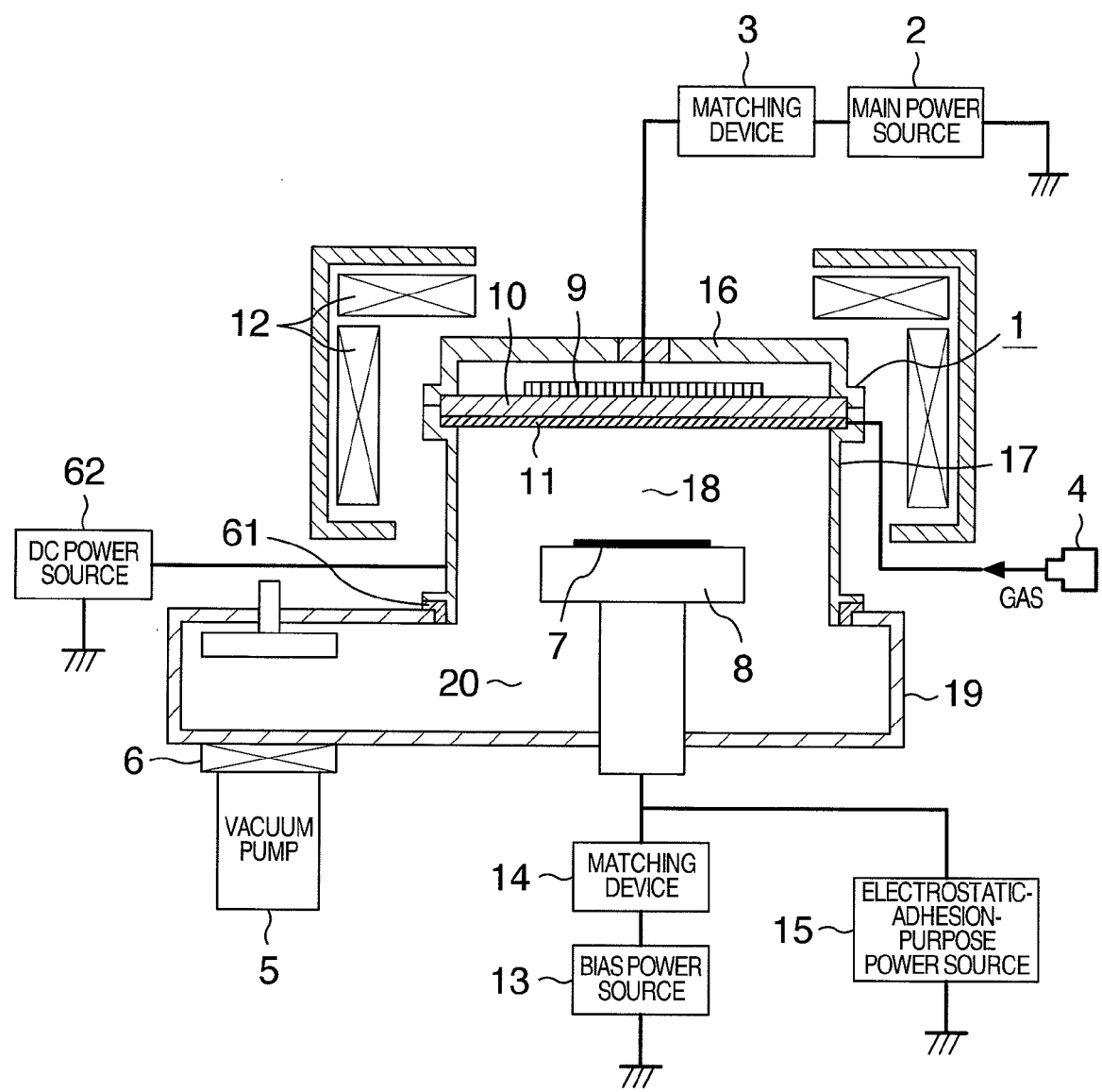
FIG. 6 is a longitudinal cross-sectional view for illustrating overview of configuration of a plasma processing apparatus according to another embodiment of the present invention.

Furthermore, referring to FIG. 6, the explanation will be given below concerning another embodiment of the present invention. FIG. 6 is a longitudinal cross-sectional view for illustrating overview of configuration of a plasma processing apparatus according to another embodiment of the present invention.

The embodiment illustrated in FIG. 6 results from directly connecting a power source to the wall surface of the processing chamber in addition to the configuration illustrated in FIG. 1. This is intended so as to be able to apply a direct-current voltage. Incidentally, illustration of the control apparatus 21 is omitted.

In the present embodiment, an insulating component member 61 for insulating the vacuum-chamber container 19 from the discharge-chamber container 17 mounted over the container 19 is inserted therebetween, thereby being cut off from the ground (earth) electric potential in a direct-current manner. Then, the discharge-chamber container 17 is connected to a direct-current power source 62. In this configuration, if a direct-current voltage is applied to the inner surface by the direct-current power source 62, the microscopic particles adhering to the inner surface are caused to depart therefrom by an electrostatic force by the direct-current voltage, thereby being eliminated. The processing steps are the same as the above-described ones in the application of the electric field from the main power source 2 via the antenna 9.

Describing an example of this process, after introducing the gas into the discharge chamber 18 and increasing the pressure up to an order of a few Pa, a positive or negative direct-current voltage is applied from the direct-current power source 62. As a result of this application, the microscopic particles adhering to the inner surface are caused to depart therefrom by the above-described electrostatic force. The voltage to be applied is set at, desirably, 1.5 kV or more. In the meantime, similarly to the above-described embodiment and modified embodiments, the control is performed in such a manner that the plasma will not be generated. Also, by generating the plasma-generating electric field in harmony with the application of the direct-current voltage, a stronger electrical force is exerted onto the microscopic particles adhering to the inner surface. This makes it possible to depart the microscopic particles more effectively.

With respect to a time at which the microscopic-particle departure processing according to the above-described embodiment is to be carried out, it is desirable that the microscopic-particle departure processing is carried out in correspondence with the deposition state of the reaction products inside the plasma processing apparatus. This means, e.g., a case where the departure processing is carried out for each sample processing, a case where the departure processing is carried out for each plural-number of samples, e.g., on 1-lot basis (25 pieces of samples, in this case), or a case where the departure processing is carried out before starting the plasma processing after a wet cleaning has been carried by performing the atmosphere opening, and further, a case where the departure processing is carried out if the particulate number increases than a certain value as a result of performing the particulate inspection. Furthermore, it is desirable that the microscopic-particle departure processing is carried out at an extent of not lowering the throughput of the fabricated products such as semiconductor devices, and so that the wet periodicity will become longer.

For this purpose, it is also effective to carry out the departure processing in combination with the ordinary plasma cleaning of the inside of the processing chamber. Incidentally, the effect of the present invention becomes less conspicuous in a state where the reaction products adhere onto the inner-wall surface of the processing chamber in a film-like manner. In order to compensate for this, the cleaning may be performed using gas plasma capable of eliminating the deposited products, and after that, the processing of the present invention may be performed. The gas family which is usable for the plasma cleaning is as follows: Namely, a gas family containing fluorine or oxygen is used for a carbon-based deposited product. A gas family containing fluorine, chlorine, bromine, or boron is used for a silicon-based deposited product. A gas family containing chlorine, bromine, or boron is used for an aluminum-based deposited product.

The main components of the deposited products can be eliminated by the plasma cleaning. However, such residual deposited products as aluminum fluoride and aluminum oxide remain which do not produce volatile reaction products in the gas family used. Also, microscopic-particle-like residual products remain which can not be competently eliminated in the predetermined plasma cleaning time. In order to eliminate these residual products, the processing in the above-described embodiments based on the application of the electric field without generating the plasma is performed. This makes it possible to eliminate both the deposited products and the adhering microscopic particles. Accordingly, a higher cleaning effect can be exhibited.

In order to examine the effect of the present embodiment, the number of the particulates has been measured which exist on the dummy sample 7 mounted on the stage 8. When the application of the electric field is not carried out, the number has been found to be ten or less. The number, however, increases steeply up to a few thousands by the application of the electric field. Here, all of the microscopic particles which have departed from the wall surface have not adhered onto the dummy sample 7. Taking this factor into consideration, it can be judged that the microscopic particles which had departed from the wall surface have increased in number tremendously. In this way, the microscopic particles adhering to the wall surface are removed, which suppresses the occurrence of the particulates.

Also, in the above-described embodiment, there exists a possibility that the microscopic particles which have departed from the wall surface will adhere to the stage 8 for the sample 7. Accordingly, as having been described in the first and second embodiments, the dummy sample 7 is mounted in advance on the stage 8. This maintains the surface of the stage 8 in a clarified state. Moreover, a positive voltage is applied to the dummy sample 7 from the electrostatic-adhesion-purpose power source 15. Otherwise, a negative electric potential may be applied thereto. Otherwise, it is effective to change the positive and negative electric potentials alternately. In whatever case, it turns out that the microscopic particles which are charged with a sign opposite to that of the applied electric potential will be attracted. In this way, the microscopic particles which have departed from the wall surface are attracted and are caused to adhere to the dummy sample 7. Then, at a point-in-time when the processing described in the embodiment has been terminated, the dummy sample 7 is transported to the outside. This method makes it possible to effectively eliminate the microscopic particles which are difficult to eject by the vacuum exhaustion using the supplied gas.

Moreover, in the above-described embodiment, the processing of the sample 7 has been performed by transporting the sample 7 for manufacturing the product into the processing chamber after the cleaning processing had been terminated. The cleaning processing, however, may also be performed by supplying the electric field without generating the plasma, while performing the exhaustion by the vacuum pump 5 in the state where the sample 7 for manufacturing the product is mounted on the stage 8. After termination of the supply of the electric field (i.e., cleaning processing) during a predetermined time and in the state where the plasma will not be generated, the processing of the sample 7 for manufacturing the product is performed by generating the plasma by supplying the electric field under a condition for generating the plasma.

In this case, before starting the processing of the sample 7, in order that the microscopic particles which have departed from the wall surface of the processing chamber and have been emitted therein will be exhausted to the outside of the processing chamber without fail, it is necessary to continue the exhaustion during a predetermined time after starting the supply of the electric field. This is because the predetermined time becomes a time which elapses until the microscopic particles emitted from the wall surface will have been exhausted by the vacuum pump 5. If the plasma is generated by the time this time has elapsed, the emitted microscopic particles cause mutual interaction with the plasma particles, thereby changing property of the electrification. This leads to a tendency that the microscopic particles will adhere to the wall surface and the sample 7 again. Such a time varies depending on volume of the processing chamber and operation performance of the vacuum pump 5. In particular, however, time V (volume of processing chamber)/S (pumping speed) can be regarded and used as the criterion.

In embodiments described so far, the etching apparatus has been selected as the example. The particulate reduction, however, is also made possible by using the same method as long as the apparatus is a one taking advantage of plasma, such as plasma CVD apparatus or plasma sputter apparatus. Also, although, in the above-described embodiment, the example has been indicated where the application of the electric field is carried out at one time, the same effect can also be obtained by shaping the electromagnetic waves into a pulse shape. Moreover, the applications of the electric field may be carried out in plural times repeatedly.

Furthermore, in the above-described embodiment, the mode of the plasma processing apparatus has been indicated as the apparatus which mounts the UHF plasma source thereon. Basically the same effect, however, can also be obtained by using an inductively-coupled plasma source or capacitively-coupled plasma source as long as the application of electromagnetic waves is executable. Also, even when an inner cylinder of dielectric such as quartz is set up inside the plasma processing chamber, electromagnetic waves also propagate in space, then propagating into the dielectric. Accordingly, basically the same effect can be obtained regarding elimination of the adhering microscopic particles.

According to the embodiments described so far, the microscopic particles adhering to the wall surface of the processing chamber can be forcefully removed in the state where the vacuum is maintained. This lengthens periodicity of the cleaning by the atmosphere opening, thereby resulting in an effect of being capable of enhancing availability of the apparatus. Also, since cleaning frequency by the atmosphere opening decreases, cleaning cost can be reduced. Moreover, the microscopic particles adhering to the wall surface are reduced, and as a result, the number of the particulates decreases. This allows implementation of the plasma processing in the particulate number which is sufficiently smaller than a tolerance value of the particulate number, thereby making it possible to expect an effect of enhancing yield of the plasma processing products.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method comprising the steps of:
   locating a sample inside a processing chamber in which a vacuum-processing space is constituted,
   processing a layer to be processed which is disposed on a surface of said sample using plasma inside of said processing chamber which is generated by an electric field from a high-frequency power source, and
   supplying and halting supply of high-frequency power into said processing chamber from said high-frequency power source between processing of samples in said processing chamber under a condition that no plasma is generated inside said processing chamber while exhausting the inside of said processing chamber.

2. The plasma processing method according to claim 1, further comprising the steps of:
   performing a plasma cleaning of said inside of said processing chamber; and
   after said plasma cleaning, performing said supplying and halting supply of said high-frequency power into said processing chamber from said high-frequency power source under said condition that no plasma is generated inside said processing chamber.

3. A plasma processing method according to claim 2, wherein said high-frequency power is supplied to a wall of said processing chamber facing said vacuum-processing space in which said plasma is generated, and a surface of said wall being covered by a film of dielectric material.

4. A plasma processing method according to claim 1, wherein said high-frequency power is supplied to a wall of said processing chamber facing said vacuum-processing space in which said plasma is generated, and a surface of said wall being covered by a film of dielectric material.

5. A plasma processing method comprising the steps of:
   locating a sample inside a processing chamber in which a vacuum-processing space is constituted;
   processing a layer to be processed which is disposed on a surface of the sample using plasma inside of the processing chamber which is generated by an electric field from a high-frequency power source; and
   supplying and halting supply of high-frequency power from the high-frequency power source into the processing chamber between processings of samples under a condition of performing no discharge inside of the processing chamber while exhausting the inside of the processing chamber.

6. A plasma processing method according to claim 5, further comprising the steps of:
- performing a plasma cleaning of the inside of the processing chamber; and
- after the plasma cleaning from the high-frequency power source, performing the supplying and halting supply of the high-frequency power into the processing chamber under the condition of performing no discharge inside the processing chamber.

7. A plasma processing method according to claim 6, wherein the high-frequency power is supplied to a wall of the processing chamber facing the vacuum-processing space in which the plasma is generated, and a surface of the wall being covered by a film of dielectric material.

8. A plasma processing method according to claim 5, wherein the high-frequency power is supplied to a wall of the processing chamber facing the vacuum-processing space in which the plasma is generated, and a surface of the wall being covered by a film of dielectric material.

* * * * *